(12) United States Patent
Zhang et al.

(10) Patent No.: US 10,748,992 B2
(45) Date of Patent: Aug. 18, 2020

(54) SEMICONDUCTOR ELEMENT

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 27 days.

(21) Appl. No.: 15/916,436

(22) Filed: Mar. 9, 2018

(65) Prior Publication Data

US 2018/0342579 A1    Nov. 29, 2018

(30) Foreign Application Priority Data

May 24, 2017   (CN) .......................... 2017 1 0375322

(51) Int. Cl.
| | |
|---|---|
| *H01L 31/0224* | (2006.01) |
| *H01L 29/06* | (2006.01) |
| *H01L 51/00* | (2006.01) |
| *H01L 29/16* | (2006.01) |
| *H01L 21/02* | (2006.01) |
| *H01L 29/41* | (2006.01) |
| *B82Y 30/00* | (2011.01) |
| *H01L 51/05* | (2006.01) |

(52) U.S. Cl.
CPC .... *H01L 29/0673* (2013.01); *H01L 21/02425* (2013.01); *H01L 21/02631* (2013.01); *H01L 29/1608* (2013.01); *H01L 51/0048* (2013.01); *B82Y 30/00* (2013.01); *H01L 29/413* (2013.01); *H01L 51/0583* (2013.01)

(58) Field of Classification Search
CPC ................................................ H01L 31/022466
See application file for complete search history.

(56) References Cited

U.S. PATENT DOCUMENTS

| | | | |
|---|---|---|---|
| 2008/0178924 | A1 | 7/2008 | Kempa et al. |
| 2009/0260679 | A1 | 10/2009 | Sun et al. |

(Continued)

FOREIGN PATENT DOCUMENTS

| | | |
|---|---|---|
| CN | 101667611 A | 3/2010 |
| CN | 105489694 A | 4/2016 |

(Continued)

*Primary Examiner* — Peniel M Gumedzoe
*Assistant Examiner* — Christopher A Johnson
(74) *Attorney, Agent, or Firm* — ScienBiziP, P.C.

(57) ABSTRACT

A semiconductor element includes a semiconductor structure, a carbon nanotube and a conductive film. The semiconductor structure includes a P-type semiconductor layer and an N-type semiconductor layer and defines a first surface and a second surface. A thickness of the semiconductor structure ranges from 1 nanometer to 100 nanometers. The carbon nanotube is located on the first surface of the semiconductor. The conductive film is located on the second surface of the semiconductor. The conductive film is formed on the second surface by a depositing method or a coating method. The carbon nanotube, the semiconductor structure and the conductive film are stacked with each other to form a multi-layered stereoscopic structure.

11 Claims, 5 Drawing Sheets

(56) References Cited

U.S. PATENT DOCUMENTS

| | | | |
|---|---|---|---|
| 2011/0139249 A1* | 6/2011 | Garnett | H01L 21/02422 |
| | | | 136/260 |
| 2011/0220191 A1* | 9/2011 | Flood | B82Y 10/00 |
| | | | 136/255 |
| 2011/0253982 A1 | 10/2011 | Wang et al. | |
| 2012/0042952 A1 | 2/2012 | Yi et al. | |
| 2015/0333201 A1* | 11/2015 | Sargent | H01L 31/0324 |
| | | | 136/250 |
| 2016/0285018 A1* | 9/2016 | Shahal | H01L 51/0012 |

FOREIGN PATENT DOCUMENTS

| | | |
|---|---|---|
| CN | 205376554 | 7/2016 |
| JP | 2004-64028 A | 2/2004 |
| JP | 2008-55375 | 3/2008 |
| JP | 2010-93118 | 4/2010 |
| JP | 2012-525699 A | 10/2012 |
| TW | 200845404 A | 11/2008 |
| TW | 200947722 A | 11/2009 |

* cited by examiner

SEMICONDUCTOR ELEMENT

CROSS-REFERENCE TO RELATED APPLICATIONS

This application claims all benefits accruing under 35 U.S.C. § 119 from China Patent Application No. 201710375322.8, filed on May 24, 2017, in the China Intellectual Property Office, the contents of which are hereby incorporated by reference.

FIELD

The present disclosure relates to a semiconductor element.

BACKGROUND

A heterojunction is an interface region formed by a contact of two different semiconductor materials. According to the conductivity types of different semiconductor materials, the heterojunction can be divided into homogeneous heterojunction (P-p junction or N-n junction) and heterotypic heterojunction (P-n or p-N). A heterostructure can be formed by multilayer heterojunctions. The heterostructure can be used in semiconductor element and semiconductor device.

BRIEF DESCRIPTION OF THE DRAWINGS

Implementations of the present technology will now be described, by way of example only, with reference to the attached figures, wherein.

DETAILED DESCRIPTION

Figure 1:
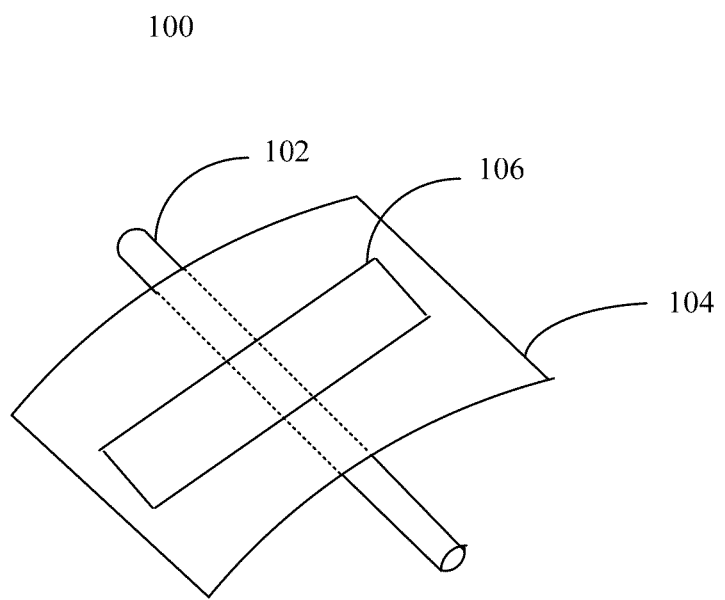
FIG. 1 is a structure schematic view of one embodiment of a semiconductor element.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Referring to FIG. 1, one embodiment is described in relation to a semiconductor element 100. The semiconductor element 100 includes a carbon nanotube 102, a semiconductor structure 104 and a conductive film 106. A thickness of the semiconductor structure 104 ranges from 1 nanometer to about 100 nanometers. The semiconductor structure 104 has a film structure defining a first surface (not labeled) and a second surface (not labeled). The first surface and the second surface are two opposite surfaces. The carbon nanotube 102 is oriented along a first direction and located on the first surface 104a. In one embodiment, there is only one carbon nanotube 102 located on the first surface. The conductive film 106 is located on the second surface. The semiconductor structure 104 is sandwiched between the carbon nanotube 102 and the conductive film 106. In one embodiment, the semiconductor element 100 consists of the carbon nanotube 102, the semiconductor structure 104 and the conductive film 106.

The carbon nanotube 102 is a metallic carbon nanotube. The carbon nanotube 102 can be a single-walled carbon nanotube, a double-walled carbon nanotube, or a multi-walled carbon nanotube. A diameter of the carbon nanotube 102 can range from about 0.5 nanometers to about 150 nanometers. In one embodiment, the diameter of the carbon nanotube 102 ranges from about 1 nanometer to about 10 nanometers. In another embodiment, the carbon nanotube 102 is a single-walled carbon nanotube, and the diameter of the carbon nanotube 102 ranges from about 1 nanometer to about 5 nanometers. In one embodiment, the carbon nanotube 102 is a metallic single-walled carbon nanotube, and the diameter of the carbon nanotube 102 is about 1 nanometer.

Figure 2:
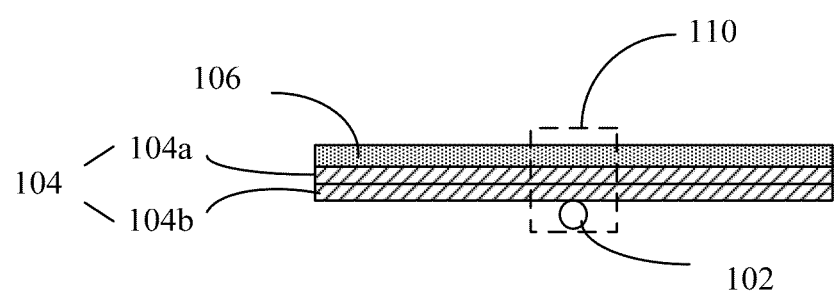
FIG. 2 is a side structure schematic view of the semiconductor element in FIG. 1 according to one embodiment.
Figure 3:
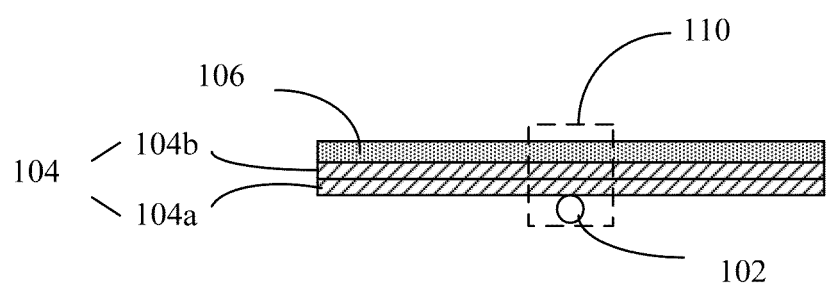
FIG. 3 is a side structure schematic view of the semiconductor element in FIG. 1 according to another embodiment.

The semiconductor structure 104 can be a two-dimensional structure. The semiconductor structure 104 includes a P-type semiconductor layer 104a and an N-type semiconductor layer 104b. The P-type semiconductor layer 104a and the N-type semiconductor layer 104b are overlapped with each other. Referring to FIG. 2, in one embodiment, the first surface of the semiconductor structure 104 is a surface of the P-type semiconductor layer 104a, the second surface of the semiconductor structure 104 is a surface of the N-type semiconductor layer 104b. The carbon nanotube 102 is located on the surface of the P-type semiconductor layer 104a, the conductive film 106 is located on the surface of the N-type semiconductor layer 104b. Referring to FIG. 3, in another embodiment, the first surface of the semiconductor structure 104 is the surface of the N-type semiconductor layer 104b, the second surface of the semiconductor structure 104 is the surface of the P-type semiconductor layer 104a. The carbon nanotube 102 is located on the surface of the N-type semiconductor layer 104b, the conductive film 106 is located on the surface of the P-type semiconductor layer 104a. A material of the P-type semiconductor layer 104a or the N-type semiconductor layer 104b can be inorganic compound semiconductors, elemental semiconductors or organic semiconductors, such as gallium arsenide, silicon carbide, polysilicon, monocrystalline silicon, naphthalene or molybdenum sulfide. In one embodiment, the material of the N-type semiconductor layer 104b is Molybdenum sulfide ($MoS_2$), and the thickness of the N-type semiconductor layer 104b is about 2.6 nanometers; the material of the P-type semiconductor layer 104a is Tungsten selenide (Wse2), and the thickness of the P-type semiconductor layer 104a is 6 nanometers.

A material of the conductive film 106 can be metal, conductive polymer or ITO. The conductive film 106 is directly deposited on or coated on the second surface 109b of the semiconductor structure 104. A method of depositing the conductive film 106 on the first surface of the semiconductor structure 104 is not limited, and can be ion sputtering or magnetron sputtering. A thickness of the conductive film 106 is not limited, and can range from 5 nanometers to 100 micrometers. In some embodiments, the thickness of the conductive film 106 ranges from 5 nanometers to 100 nanometers. In other embodiments, the thickness of the conductive film 106 ranges from 5 nanometers to 20 nanometers. A shape of the conductive film 106 is not limited, and can be bar, linear, square, or the like. In one embodiment, the conductive film 106 is strip-shaped.

A multi-layered stereoscopic structure 110 is formed by the carbon nanotube 102, the semiconductor structure 104 and the conductive film 106. A cross-sectional area of the multi-layered stereoscopic structure 110 is determined by the carbon nanotube 102. Because the carbon nanotube 102 is in nanoscale, an the cross-sectional area of the multi-layered stereoscopic structure 110 is nanoscale. The multi-layered stereoscopic structure 110 defines a first cross-sectional surface and a second cross-sectional surface. The first cross-sectional surface is parallel with the surface of the semiconductor structure 104. The second cross-sectional surface is perpendicular with the surface of the semiconductor structure 104. That is, the first cross-sectional surface is perpendicular with the second cross-sectional surface. An area of the first cross-sectional surface is determined by the diameter of the carbon nanotube 102 and a thickness of the multi-layered stereoscopic structure 110. An area of the second cross-sectional surface is determined by the length of the carbon nanotube 102 and the thickness of the multi-layered stereoscopic structure 110. In one embodiment, the cross-sectional area of the multi-layered stereoscopic structure 110 ranges from about 0.25 $nm^2$ to about 1000 $nm^2$. In another embodiment, the cross-sectional area of the multi-layered stereoscopic structure 110 ranges from about 1 $nm^2$ to about 100 $nm^2$.

A Van der Waals heterostructure is formed by the multi-layered stereoscopic structure 110 between the carbon nanotube 102, the semiconductor structure 104 and the conductive film 106. In use of the semiconductor element 100, a Schottky junction is formed between the carbon nanotube 102, the semiconductor structure 104 and the conductive film 106 in the multi-layered stereoscopic structure 110. A current can get through the multi-layered stereoscopic structure 110. The carbon nanotube 102 and the conductive film 106 can be regarded as two electrodes located on surfaces of the semiconductor structure 104. When a voltage is applied on the semiconductor element 100 from the carbon nanotube 102 and the conductive film 106, a current flows along the multi-layered stereoscopic structure 110. A working part of the semiconductor element 100 is multi-layered stereoscopic structure 110. As such, a size of the semiconductor element 100 is larger than or equal to the multi-layered stereoscopic structure 110. As such, the semiconductor element 100 is in nanoscale. The semiconductor element 100 has a lower energy consumption, a higher spatial resolution, and a higher integrity.

The semiconductor element 100 of the present invention is based on a carbon nanotube asymmetric Van der Waals heterostructure, in which the semiconductor structure 104 is a two-dimensional structure asymmetrically sandwiched between the carbon nanotubes 102 and the conductive film 106. The semiconductor structure 104 includes a P-N junction, the carbon nanotube 102 and the conductive film 106 are two electrodes of the P-N junction. By applying a voltage to the carbon nanotube 102 and the conductive film 106, one-way conduction of the semiconductor element 100 can be achieved. In the present invention, the carbon nanotube 102 are in contact with the first surface of the semiconductor structure 104, the conductive film 106 is in contact with the second surface of the semiconductor structure 104, and the asymmetric contact of the carbon nanotube 102 and the conductive film 106 with respect to the 2D semiconductor structure 104 makes the Van der Waals heterostructure more excellent transport performance. When the semiconductor element 100 is used in a transistor, the van der Waals heterostructure exhibits asymmetric output characteristics at opposite source-drain biases. The diversity of transport performance is mainly because of the fact that a Fermi level of carbon nanotube is easily modulated and the semiconductor element is asymmetrically contacted, while the carbon nanotube electrode is suitable for either electron-type or hole-type conductivity. The limitations of tunable device functionality and lateral device size make this semi-conducting element 100 of asymmetric Van der Waals heterostructure including carbon nanotubes unique and have great potential for future nanoelectronics field and nanoelectronics field.

Figure 4:
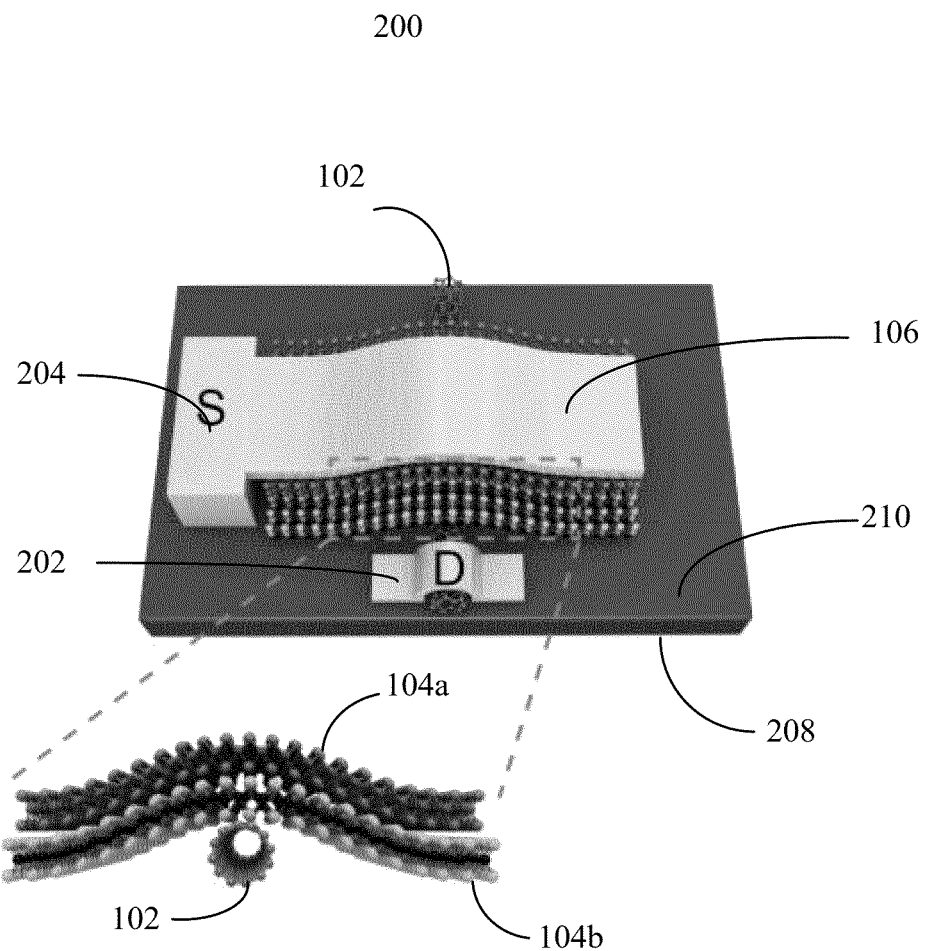
FIG. 4 is a structure schematic view of one embodiment of a semiconductor device.

Referring to FIG. 4, a semiconductor device 200 according to one embodiment is provided. The semiconductor device 200 includes a first electrode 202, a second electrode 204, the semiconductor element 100, and a third electrode 208. The semiconductor element 100 is electrically connected to the first electrode 202 and the second electrode 204. The third electrode 208 is insulated from the semiconductor element 100, the first electrode 202 and the second electrode 204 through an insulating layer 210. Characteristics of the semiconductor element 100 is the same as that of the semiconductor element 100 discussed before.

In the semiconductor device 200, the third electrode 208 and the insulating layer 210 are stacked, and the semiconductor element 100 is located on a surface of the insulating layer 210, the insulating layer 210 is located between the third electrode 208 and the semiconductor element 100. In the semiconductor element 100, the carbon nanotube 102 are directly located on the surface of the insulating layer 210, the semiconductor structure 104 is located above the carbon nanotubes 102, the carbon nanotubes 102 are located between the semiconductor structure 104 and the insulating layer 210, and the conductive film 106 is located above the semiconductor structure 104.

The first electrode 202 and the second electrode 204 are made of conductive material, such as metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the first electrode 202 and the second electrode 204 are both conductive films. A thickness of the conductive film ranges from about 2 microns to about 100 microns. In this embodiment, the first electrode 202 and the second electrode 204 are metal composite structures of Au and Ti. Specifically, the metal composite structure includes an Au layer and a Ti layer overlapped with each other. The Ti layer has a thickness of 5 nm and the Au layer has a thickness of 50 nm. In this embodiment, the first electrode 202 is electrically connected to the carbon nanotube 102 and located at one end of the carbon nanotube 102 and adhered to the surface of the carbon nanotube 102. The Ti layer is located on the surface of the carbon nanotube 102, the Au layer is located on a surface of the Ti layer. The second electrode 204 is electrically connected to the conductive film 106 and located on one end of the conductive film 106 and adhered on the surface of the conductive film 106, wherein the Ti layer is located on the surface of the conductive film 106, the Au layer is located on the surface of the Ti layer.

The insulating layer 210 is made of an insulating material and has a thickness of 1 nanometer to 100 micrometers. The insulating layer 210 provides the insulation between the carbon nanotubes 102 and the third electrode 208. In this embodiment, the material of the insulating layer 210 is silicon oxide.

The third electrode 208 is made of a conductive material. The conductive material may be selected from the group consisting of metal, ITO, ATO, conductive silver paste, conductive polymer, and conductive carbon nanotube. The metallic material may be aluminum, copper, tungsten, molybdenum, gold, titanium, palladium or any combination of alloys. In this embodiment, the third electrode 208 is a layered structure, the insulating layer 210 is located on the surface of the third electrode 208. The first electrode 202, the second electrode 204, and the semiconductor element 100 are located on the insulating layer 210, and are supported by the third electrode 208 and the insulating layer 210. In the present invention, the carbon nanotube 102 are directly located on the surface of the insulating layer 210, the carbon nanotube 102 are close to the third electrode 208, the conductive film 106 is far away from the third electrode 208. As such, the conductive film 106 will not generate shielding effect between the semiconductor structure 104 and the third electrode 208, and the third electrode 208 can be used to control the semiconductor element 100 when the semiconductor device 200 is used.

Figure 5:
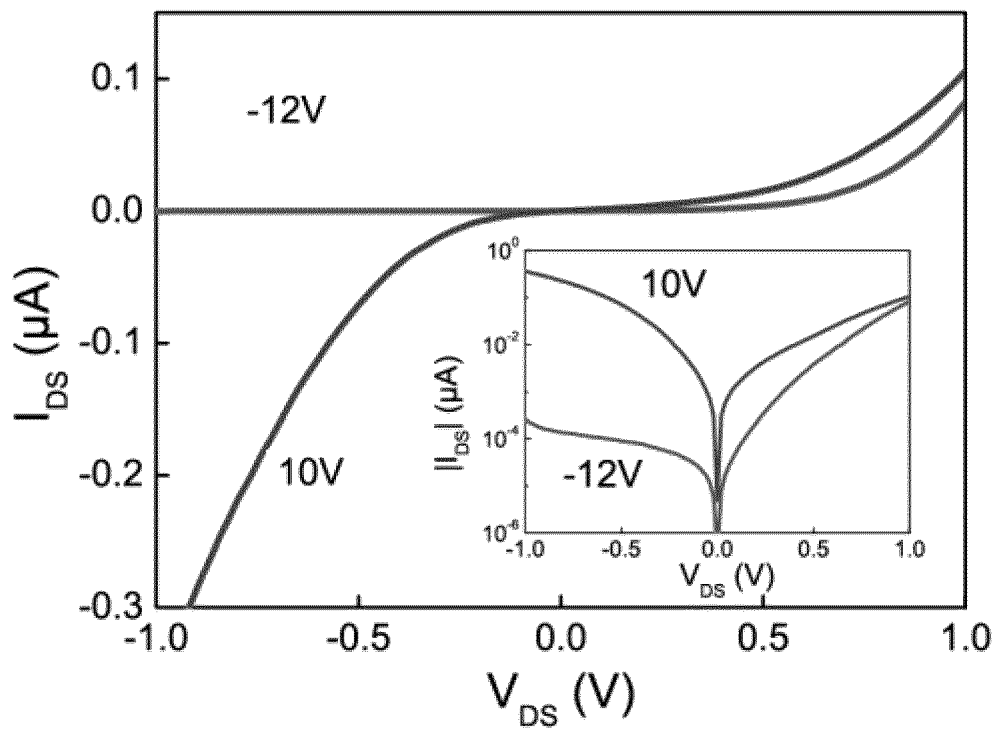
FIG. 5 is a graph showing a working characteristic curve of the semiconductor device.

In the semiconductor device 200 provided by the present invention, the carbon nanotubes 102 are directly located on the insulating layer 210 as the bottom electrode and separated from the third electrode 208 as the gate electrode by only one insulating layer 210, due to special properties of the carbon nanotube 102, the conduction of the semiconductor device 200 can be regulated by the third electrode 208, so that the semiconductor device 200 exhibits asymmetric output characteristics. In this embodiment, the carbon nanotubes 102 are located on the surface of the N-type semiconductor layer 104b, the conductive film 106 is located on the surface of the P-type semiconductor layer 104a, and the P-type semiconductor layer 104a is WSe$_2$ with a thickness of 6 nm. The N-type semiconductor layer 104b is MoS$_2$ with a thickness of 2.6 nm, the first electrode 202 is grounded. Referring to FIG. 5, the voltage of the second electrode 204 is changed in a range from −1V to 1V, when a voltage of the third electrode 208 is −12V, the semiconductor element 100 exhibits characteristics of a P-N junction; when the gate voltage is 10 V, the semiconductor device 100 exhibits characteristics of an N-N junction.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A semiconductor element comprising:
a semiconductor structure comprising a P-type semiconductor and an N-type semiconductor overlapped with each other and defining a first surface and a second surface;
a single carbon nanotube positioned on the first surface of the semiconductor structure and separable from the semiconductor structure, the single carbon nanotube being an electrode of the semiconductor structure;
a conductive film on the second surface of the semiconductor structure, wherein the semiconductor structure is located between the single carbon nanotube and the conductive film, and the single carbon nanotube, the semiconductor structure and the conductive film are stacked with each other to form a multi-layered stereoscopic structure.

2. The semiconductor element of claim 1, wherein the carbon nanotube is a metallic carbon nanotube.

3. The semiconductor element of claim 2, wherein the carbon nanotube is a single-walled carbon nanotube, and the diameter of the carbon nanotube is in a range from about 1 nanometer to about 5 nanometers.

4. The semiconductor element of claim 1, wherein a thickness of the semiconductor structure is in a range from about 1 nanometer to about 200 nanometers.

5. The semiconductor element of claim 1, wherein a material of the P-type semiconductor or the N-type semiconductor is gallium arsenide, silicon carbide, polysilicon, monocrystalline silicon, naphthalene or molybdenum sulfide.

6. The semiconductor element of claim 1, wherein the conductive film is directly formed on the second surface by a depositing method, and the depositing method comprises ion sputtering or magnetron sputtering.

7. The semiconductor element of claim 1, wherein a thickness of the conductive film is in a range from 5 nanometers to 20 nanometers.

8. The semiconductor element of claim 1, wherein a cross-sectional area of the multi-layered stereoscopic structure is in a range from about 0.25 nm$^2$ to about 1000 nm$^2$.

9. The semiconductor element of claim 8, wherein the cross-sectional area of the multi-layered stereoscopic structure is in a range from about 1 nm$^2$ to about 100 nm$^2$.

10. The semiconductor element of claim 1, wherein the first surface of the semiconductor structure is a surface of the P-type semiconductor layer, the second surface of the semiconductor structure is a surface of the N-type semiconductor layer.

11. The semiconductor element of claim 1, wherein the first surface of the semiconductor structure is the surface of the N-type semiconductor layer, the second surface of the semiconductor structure is the surface of the P-type semiconductor layer.

* * * * *